United States Patent
Hsiao

(10) Patent No.: US 8,539,430 B2
(45) Date of Patent: Sep. 17, 2013

(54) ELECTRONIC DEVICE AND METHOD FOR DETECTING EQUIVALENT SERIES INDUCTANCE

(75) Inventor: Chun-Shan Hsiao, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/334,100

(22) Filed: Dec. 22, 2011

(65) Prior Publication Data

US 2012/0291000 A1 Nov. 15, 2012

(30) Foreign Application Priority Data

May 12, 2011 (TW) ................................ 100116752

(51) Int. Cl.
*G06F 17/50* (2006.01)

(52) U.S. Cl.
USPC ............................ 716/137; 716/115; 716/136

(58) Field of Classification Search
USPC .......................... 716/137, 115, 136; 361/748
See application file for complete search history.

(56) References Cited

U.S. PATENT DOCUMENTS

| 7,269,810 B1* | 9/2007 | Weller et al. ................... 716/115 |
| 7,705,423 B2* | 4/2010 | Swaminathan et al. ....... 257/532 |
| 2009/0172618 A1* | 7/2009 | Fujimori et al. .................... 716/5 |
| 2009/0213558 A1* | 8/2009 | Osaka et al. .................... 361/748 |
| 2011/0073359 A1* | 3/2011 | Cases et al. .................... 174/266 |
| 2011/0239176 A1* | 9/2011 | Osaka et al. ................... 716/115 |
| 2011/0321000 A1* | 12/2011 | Fujimori ....................... 716/136 |

* cited by examiner

*Primary Examiner* — Jack Chiang
*Assistant Examiner* — Brian Ngo
(74) *Attorney, Agent, or Firm* — Altis Law Group, Inc.

(57) ABSTRACT

In a method for detecting equivalent series inductances (ESL) of an electrical component of a printed circuit board (PCB), the electrical component and one or more signal lines connected with the electrical component are selected from a layout diagram of the PCB. The method selects a standard range of the ESL of the selected electrical component, calculates an ESL between each of the signal lines and a via hole corresponding to the signal line, and determines signal lines having ESL value that are not within the standard range. The method locates attribute data of the determined signal lines and the selected electrical component in the layout diagram of the PCB, and displays the attribute data of the determined signal lines and the selected electrical component on a display device.

12 Claims, 3 Drawing Sheets

ELECTRONIC DEVICE AND METHOD FOR DETECTING EQUIVALENT SERIES INDUCTANCE

BACKGROUND

1. Technical Field

Embodiments of the present disclosure relate to printed circuit board design technology, and particularly to an electronic device and method for detecting equivalent series inductance of an electrical component of a printed circuit board.

2. Description of Related Art

Printed circuit board (PCB) layout is an important step in the manufacturing process of a motherboard and is closely related to product quality. If an equivalent series inductance (ESL) of an electrical component (e.g., a capacitor) in a PCB does not fall in a standard range, then interference noise or electro magnetic interference (EMI) is generated. The interference noise or EMI can interface with an ability to respond a current changing by the electrical component. ESL detection of the electrical components are usually checked manually; it is a time-consuming work and results in mistakes. Therefore, a more efficient method for detecting ESL of an electrical component of a printed circuit board is desired.

DETAILED DESCRIPTION

All of the processes described below may be embodied in, and fully automated via, functional code modules executed by one or more general purpose electronic devices or processors. The code modules may be stored in any type of non-transitory computer-readable medium or other storage device. Some or all of the methods may alternatively be embodied in specialized hardware. Depending on the embodiment, the non-transitory computer-readable medium may be a hard disk drive, a compact disc, a digital video disc, a tape drive or other suitable storage medium.

Figure 1:
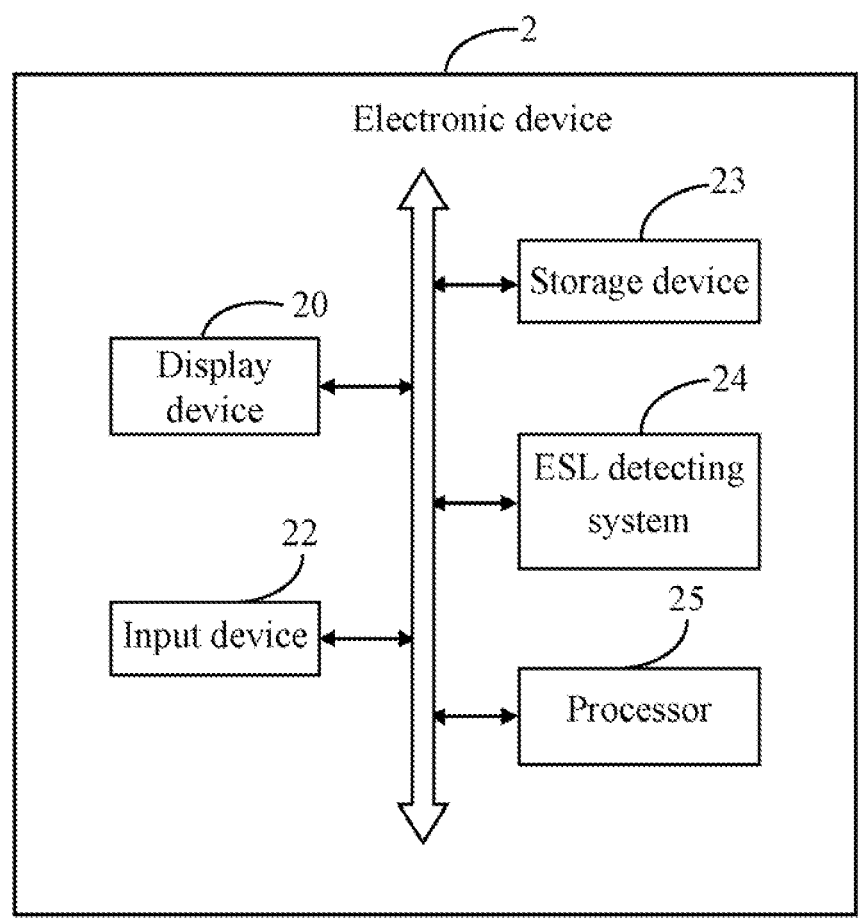
FIG. 1 is a block diagram of one embodiment of an electronic device including an ESL detecting system.

FIG. 1 is a block diagram of one embodiment of an electronic device 2 including an equivalent series inductance ("ESL") detecting system 24. In the embodiment, the electronic device 2 further includes a display device 20, an input device 22, a storage device 23, and at least one processor 25. The electronic device 2 may be a computer, a server, a tablet device, a mobile phone, or any other computing device. FIG. 1 illustrates only one example of the electronic device 2 that may include more or fewer components than illustrated, or a different configuration of the various components in other embodiments.

The display device 20 may be a liquid crystal display (LCD) or a cathode ray tube (CRT) display, and the input device 22 may be a mouse, a keyboard, a touch screen, and/or a touchpad used to input computer readable data.

The ESL detecting system 24 is used to determine one or more signal lines of an electrical component (e.g., a capacitor) having ESL value that are not within a preset standard range in an electronic layout diagram (hereinafter referred to as "layout diagram") of a printed circuit board (PCB), and locate a position of each of the determined signal lines in the layout diagram. For example, the layout diagram may be a computer aided design (CAD) format. In one embodiment, the ESL detecting system 24 may include computerized instructions in the form of one or more programs that are executed by the at least one processor 25 and stored in the storage device 23 (or memory). A detailed description of the ESL detecting system 24 will be given in the following paragraphs.

Figure 2:
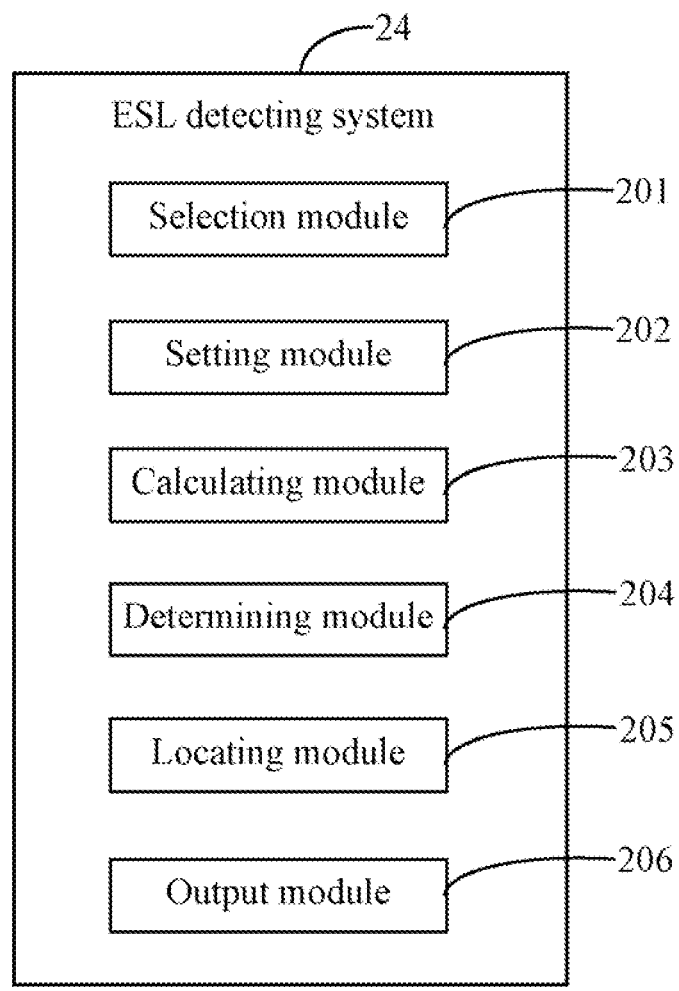
FIG. 2 is a block diagram of function modules of the ESL detecting system included in the electronic device of FIG. 1.

FIG. 2 is a block diagram of function modules of the ESL detecting system 24 included in the electronic device 2. In one embodiment, the ESL detecting system 24 may include one or more modules, for example, a selection module 201, a setting module 202, a calculating module 203, a determining module 204, a locating module 205, and an output module 206. In general, the word "module", as used herein, refers to logic embodied in hardware or firmware, or to a collection of software instructions, written in a programming language, such as, Java, C, or assembly. One or more software instructions in the modules may be embedded in firmware, such as in an EPROM. The modules described herein may be implemented as either software and/or hardware modules and may be stored in any type of non-transitory computer-readable medium or other storage device. Some non-limiting examples of non-transitory computer-readable medium include CDs, DVDs, BLU-RAY, flash memory, and hard disk drives.

Figure 3:
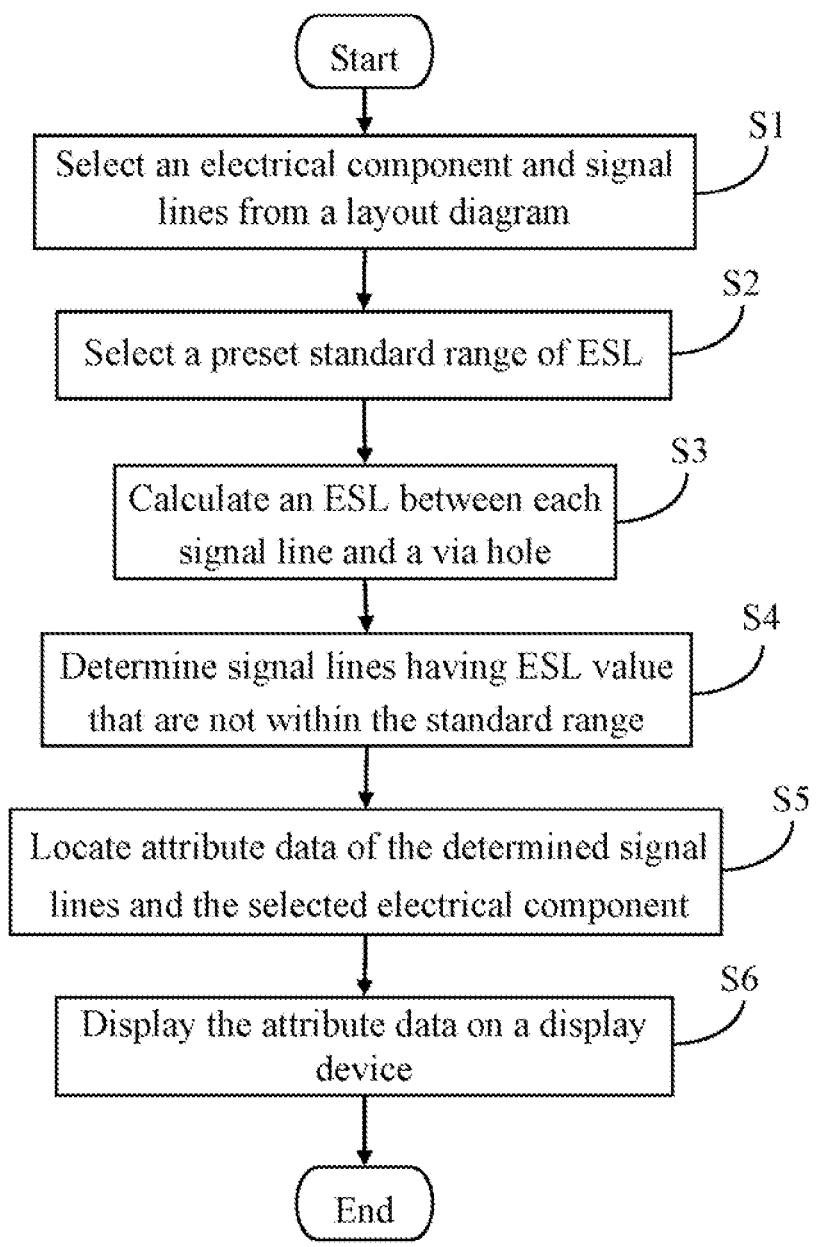
FIG. 3 is a flowchart of one embodiment of a method for detecting ESL of an electrical component of a printed circuit board using the electronic device of the FIG. 1.

FIG. 3 is a flowchart of one embodiment of a method for detecting ESL of an electrical component of a PCB using the electronic device 2. Depending on the embodiment, additional blocks may be added, others removed, and the ordering of the blocks may be changed.

In block S1, the selection module 201 selects an electrical component from the layout diagram of the PCB, and further selects a plurality of signal lines connected with the selected electrical component. In one embodiment, the layout diagram is stored in the storage device 23 of the electronic device 2. The electrical component may be a capacitor or an inductor, for example. A plurality of electrical components may be selected at the same time in other embodiments.

In block S2, the setting module 202 selects a preset standard range of the ESL of the selected electrical component using the input device 22 of the electronic device 2. In one embodiment, the standard range may be [0 nH, 0.1 nH], where "nH (nano henry)" represents a unit of the ESL.

In block S3, the calculating module 203 calculates an ESL between each of the signal lines and a via hole of the layout diagram corresponding to the signal line.

For example, the ESL between one of the signal lines and the corresponding via hole may be calculated using an empirical formula of $L = e \times h \times [\ln(4h/d)+1]$, where "e" represents a preset value (e.g., an empirical value of 5.08), "h" represents a length of the via hole, "d" represents a diameter of the via hole, "ln( )" represents a natural logarithm, and "L" represents a calculated ESL. The ESL between the signal line and the corresponding via hole may be calculated using other suitable empirical formula according to a type of the selected electrical component.

In block S4, the determining module 204 determines one or more signal lines of the layout diagram of the PCB having ESL value that are not within the standard range. For example, if the ESL of one of the signal lines is 0.5 nH, the determining module 204 determines that ESL of the signal line is not within the standard range.

In block S5, the locating module 205 locates attribute data of the determined signal lines and the selected electrical component in the layout diagram of the PCB. In one embodiment, the attribute data of the determined signal lines may include a position of each of the determined signal lines, coordinates of each of the determined signal lines, and a layer (e.g., a signal layer) of each of the determined signal lines in the PCB. The attribute data of the selected electrical component may include a position of the selected electrical component, coordinates of the selected electrical component, and a layer (i.e., a power layer) of the selected electrical component in the PCB.

In block S6, the output module 204 displays the attribute data of the determined signal lines and the selected electrical component on the display device 20 of the electronic device 2. Furthermore, the output module 204 may output the attribute data of the determined signal lines and the selected electrical component into an ESL detecting report of the PCB, and store the ESL detecting report in the storage device 23 of the electronic device 2.

It should be emphasized that the above-described embodiments of the present disclosure, particularly, any embodiments, are merely possible examples of implementations, merely set forth for a clear understanding of the principles of the disclosure. Many variations and modifications may be made to the above-described embodiment(s) of the disclosure without departing substantially from the spirit and principles of the disclosure. All such modifications and variations are intended to be included herein within the scope of this disclosure and the present disclosure and protected by the following claims.

What is claimed is:

1. A computer-implemented method for detecting equivalent series inductance (ESL) of an electrical component of a printed circuit board (PCB) using an electronic device, the method comprising:

selecting an electrical component from a layout diagram of the PCB stored in a storage device of the electronic device, and selecting a plurality of signal lines connected with the selected electrical component;

selecting a standard range of the ESL of the selected electrical component using an input device of the electronic device;

calculating an ESL value between each of the selected signal lines and a via hole corresponding to the selected signal line using a formula of $L=e \times h \times [\ln(4h/d)+1]$, wherein "e" represents a preset value, "h" represents a length of the via hole, "d" represents a diameter of the via hole, "ln( )" represents a natural logarithm, and "L" represents the calculated ESL value;

determining one or more signal lines whose ESL values are not within the standard range from the selected signal lines;

locating attribute data of the determined signal lines and the selected electrical component in the layout diagram of the PCB; and displaying the attribute data of the determined signal lines and the selected electrical component on a display device of the electronic device.

2. The method according to claim 1, wherein the attribute data of the determined signal lines comprise a position of each of the determined signal lines, coordinates of each of the determined signal lines, and a layer of each of the determined signal lines in the PCB.

3. The method according to claim 1, wherein the attribute data of the selected electrical component comprise a position of the selected electrical component, coordinates of the selected electrical component, and a layer of the selected electrical component in the PCB.

4. The method according to claim 1, further comprising:

outputting the attribute data of the determined signal lines and the selected electrical component into an ESL detecting report; and storing the ESL detecting report in the storage device of the electronic device.

5. An electronic device, comprising:

a storage device;

at least one processor; and one or more modules that are stored in the storage device and executed by the at least one processor, the one or more modules comprising instructions:

to select an electrical component from a layout diagram of a printed circuit board (PCB) stored in the storage device, and select a plurality of signal lines connected with the selected electrical component;

to select a standard range of an equivalent series inductance (ESL) of the selected electrical component using an input device of the electronic device;

to calculate an ESL value between each of the selected signal lines and a via hole corresponding to the selected signal line using a formula of $L=e \times h \times [\ln(4h/d)+1]$, wherein "e" represents a preset value, "h" represents a length of the via hole, "d" represents a diameter of the via hole, "ln( )" represents a natural logarithm, and "L" represents the calculated ESL value;

to determine one or more signal lines whose ESL values are not within the standard range from the selected signal lines;

to locate attribute data of the determined signal lines and the selected electrical component in the layout diagram of the PCB; and to display the attribute data of the determined signal lines and the selected electrical component on a display device of the electronic device.

6. The electronic device according to claim 5, wherein the attribute data of the determined signal lines comprise a position of each of the determined signal lines, coordinates of each of the determined signal lines, and a layer of each of the determined signal lines in the PCB.

7. The electronic device according to claim 5, wherein the attribute data of the selected electrical component comprise a position of the selected electrical component, coordinates of the selected electrical component, and a layer of the selected electrical component in the PCB.

8. The electronic device according to claim 5, wherein the one or more modules further comprise instructions:

to output the attribute data of the determined signal lines and the selected electrical component into an ESL detecting report; and to store the ESL detecting report in the storage device of the electronic device.

9. A non-transitory storage medium having stored thereon instructions that, when executed by a processor of an electronic device, causes the electronic device to perform a method for detecting equivalent series inductance (ESL) of an electrical component of a printed circuit board (PCB) using an electronic device, the method comprising:

selecting an electrical component from a layout diagram of the PCB stored in a storage device of the electronic device, and selecting a plurality of signal lines connected with the selected electrical component;

selecting a standard range of the ESL of the selected electrical component using an input device of the electronic device;

calculating an ESL value between each of the selected signal lines and a via hole corresponding to the selected signal line using a formula of $L = e \times h \times [\ln(4h/d)+1]$, wherein "e" represents a preset value, "h" represents a length of the via hole, "d" represents a diameter of the via hole, "ln( )" represents a natural logarithm, and "L" represents the calculated ESL value;

determining one or more signal lines whose ESL values are not within the standard range from the selected signal lines;

locating attribute data of the determined signal lines and the selected electrical component in the layout diagram of the PCB; and displaying the attribute data of the determined signal lines and the selected electrical component on a display device of the electronic device.

10. The non-transitory storage medium according to claim 9, wherein the attribute data of the determined signal lines comprise a position of each of the determined signal lines, coordinates of each of the determined signal lines, and a layer of each of the determined signal lines in the PCB.

11. The non-transitory storage medium according to claim 9, wherein the attribute data of the selected electrical component comprise a position of the selected electrical component, coordinates of the selected electrical component, and a layer of the selected electrical component in the PCB.

12. The non-transitory storage medium according to claim 9, wherein the method further comprises:

outputting the attribute data of the determined signal lines and the selected electrical component into an ESL detecting report; and storing the ESL detecting report in the storage device of the electronic device.

\* \* \* \* \*